United States Patent
Asai et al.

(10) Patent No.: US 7,221,242 B2
(45) Date of Patent: May 22, 2007

(54) BULK ACOUSTIC WAVE RESONATOR AND MANUFACTURING METHOD THEREOF, FILTER USING THE SAME, SEMICONDUCTOR INTEGRATED CIRCUIT DEVICE USING THE SAME, AND HIGH FREQUENCY MODULE USING THE SAME

(75) Inventors: Kengo Asai, Hachioji (JP); Hisanori Matsumoto, Kokubunji (JP); Atsushi Isobe, Kodaira (JP); Mitsutaka Hikita, Hachioji (JP)

(73) Assignee: Hitachi Media Electronics Co., Ltd, Iwate-ken (JP)

( * ) Notice: Subject to any disclaimer, the term of this patent is extended or adjusted under 35 U.S.C. 154(b) by 26 days.

(21) Appl. No.: 11/067,374

(22) Filed: Feb. 28, 2005

(65) Prior Publication Data
US 2006/0139122 A1  Jun. 29, 2006

(30) Foreign Application Priority Data
Dec. 24, 2004  (JP) .............................. 2004-372534

(51) Int. Cl.
H03H 9/00 (2006.01)
H01L 41/00 (2006.01)

(52) U.S. Cl. ........................ 333/187; 333/191; 310/324
(58) Field of Classification Search ................ 333/187, 333/188, 189, 190, 191, 192; 310/324; 257/418
See application file for complete search history.

(56) References Cited

U.S. PATENT DOCUMENTS 4,642,508 A    2/1987 Suzuki et al.

(Continued)

FOREIGN PATENT DOCUMENTS

JP    60-189307    3/1984

(Continued)

OTHER PUBLICATIONS

R. Ruby et al., "Micromachined Thin Film Bulk Acoustic Resonators", 1994 IEEE International Frequency Control Symposium, pp. 135-138.

(Continued)

*Primary Examiner*—Dean Takaoka
(74) *Attorney, Agent, or Firm*—Reed Smith LLP; Stanley P. Fisher, Esq.; Juan Carlos A. Marquez, Esq.

(57) ABSTRACT

A bulk acoustic wave resonator in which the problem of the technology for forming the diaphragm structure is resolved, which is more compact and improved the frequency accuracy, and the manufacturing method thereof, a filter using the same, a semiconductor integrated circuit device using the same, and a high frequency module using the same are provided. The bulk acoustic wave resonator according to the present invention comprises a substrate having a first surface and a second surface opposite to the first surface, and a staked resonator including a first electrode film in contact with the first surface, a piezoelectric film overlaying the first electrode film and a second electrode film overlaying the piezoelectric film. The substrate is provided with an air gap including a first aperture opening at the first surface and a second aperture opening at the second surface at the position corresponding to the staked resonator, respectively and having air gap generally vertical shape to the first surface, and another air gap having a tapered shape in the vicinity of the first surface.

19 Claims, 12 Drawing Sheets

U.S. PATENT DOCUMENTS

| | | | |
|---|---|---|---|
| 5,965,970 A * | 10/1999 | Takeuchi et al. | 310/324 |
| 6,060,818 A | 5/2000 | Ruby et al. | |
| 6,457,221 B1 * | 10/2002 | Park | 29/25.35 |
| 6,734,763 B2 | 5/2004 | Nishihara et al. | |
| 7,053,456 B2 * | 5/2006 | Matsuo | 257/415 |

FOREIGN PATENT DOCUMENTS

| | | |
|---|---|---|
| JP | 2000-69594 | 6/1999 |
| JP | 2003-204239 | 1/2002 |

OTHER PUBLICATIONS

T. Nishihara et al, "High Performance and Miniature Thin Film Bulk Acoustic Wave Filters for 5 GHz", 2002 IEEE International Ultrasonics Symposium, pp. 969-972.

* cited by examiner

US 7,221,242 B2

BULK ACOUSTIC WAVE RESONATOR AND MANUFACTURING METHOD THEREOF, FILTER USING THE SAME, SEMICONDUCTOR INTEGRATED CIRCUIT DEVICE USING THE SAME, AND HIGH FREQUENCY MODULE USING THE SAME

CROSS-REFERENCE TO RELATED APPLICATION

The present application claims priority from Japanese patent application No. JP 2004-372534 filed on Dec. 24, 2004, the content of which is hereby incorporated by reference into this application.

FIELD OF THE INVENTION

The present invention relates to a resonator using acoustic wave, especially, a bulk acoustic wave resonator using bulk acoustic wave, a filter using the same (hereinafter referred to as a bulk acoustic wave resonator filter) and a manufacturing method thereof.

BACKGROUND OF THE INVENTION

Along with the popularization of mobile communication as represented by cellular phones, the demand for a high frequency filter operated in several hundred MHz-several GHz has been increased. Among various filter technologies, the filter manufactured by using a bulk acoustic wave resonator is characterized by (1) high frequency, (2) compact, (3) excellent temperature characteristic, and (4) excellent electric strength.

The bulk acoustic wave resonator is a stacked resonator having a structure in which electrode films made of metal materials sandwiches an piezoelectric layer such as AlN and ZnO therebetween. The longitudinal resonant oscillation occurred by applying AC voltage to the stacked resonator is used. The structure of the bulk acoustic wave resonator is categorized by methods of confining the bulk acoustic wave in the piezoelectric film. Among them, there is a method that a cavity is provided on the bottom of the resonator thereby a diaphragm structure is formed. As the above mentioned technology for forming the diaphragm structure in the bulk acoustic wave resonator, there is a configuration that the piezoelectric layer is sandwiched between the bottom electrode layer and the top electrode layer, and the sandwich structure is supported on the cavity by an underlayer (cf. non-patent document 1).

As another technology for forming the diaphragm structure, there is a configuration that a sacrificial layer is patterned in an area for air gap on the support substrate, and a sandwich structure in which the piezoelectric layer is sandwiched between the bottom electrode layer and the top electrode layer is formed thereon, then, the sacrificial layer is removed to obtain an air gap on the bottom of the sandwich structure (cf. patent document 1).

As another diaphragm structure forming technology, there is a configuration that a concave portion in an area for air gap on the support substrate is previously formed, the concave portion is filled with the sacrificial layer, and a sandwich structure in which the piezoelectric layer is sandwiched between the bottom electrode layer and the top electrode layer is formed after smoothing, and then, the sacrificial layer is removed to obtain an air gap on the bottom of the sandwich structure (cf. patent document 2).

Further another technology for forming the diaphragm structure, there is a configuration that a sandwich structure in which the piezoelectric layer is sandwiched between the bottom electrode layer and the top electrode layer is provided in contact with the first surface of the support substrate, and an air gap including a first aperture opening at the first surface and a second aperture opening at the second surface at the position corresponding to the sandwich structure on the support substrate, respectively and having a generally vertical shape to the first surface being formed using Deep-RIE (cf. non-patent document 2 or patent document 3). According to the patent document 3, it is suitable for downsizing and can obtain a bulk acoustic wave resonator having an excellent resonance characteristic. Additionally it is described that since the cut surface of the support substrate is important to obtain a sufficient capability for the orientation of the piezoelectric layer, a Si(111) substrate is appropriate for the support substrate. It is also described that if a Si(100) substrate is used, the orientation of the piezoelectric layer is significantly deteriorated so that it is difficult to obtain an excellent resonance characteristic in the bulk acoustic wave resonator.

Patent document 1: Japanese Patent Laid-open No. 60-189307
Patent document 2: Japanese Patent Laid-open No. 2000-69594
Patent document 3: Japanese Patent Laid-open No. 2003-204239
Non-patent document 1: 1994 IEEE International Frequency Control Symposium pp. 135–138
Non-patent document 2: 2002 IEEE International Ultrasonics Symposium pp. 969–972

SUMMARY OF THE INVENTION

The bulk acoustic wave in a bulk acoustic wave resonator is excited by applying a voltage signal between two electrodes separated by a piezoelectric layer. Where, the path of the bulk acoustic wave has a diaphragm structure including a sandwich structure, or composed of the sandwich structure and an underlayer. The frequency is determined based on the film thickness of the sandwich structure, or the film thickness combined the sandwich structure and the underlayer. Since the top and the bottom of the diaphragm structure are acoustically isolated by air, the bulk acoustic wave is reflected on the interface between the end face of the diaphragm structure and the air thereby the leak of elastic energy from the diaphragm structure to the outside is prevented. That is to say, the bulk acoustic wave resonator is a device to convert the inputted electric signal to a mechanical excitation and resonates at the frequency in inverse proportion to the film thickness of the diaphragm structure. Utilizing this property, the bulk acoustic wave resonator can be used as a high frequency resonator in an electronic circuit.

Two or more bulk acoustic wave resonators having the different resonance frequency should be electrically connected in order to manufacture a bulk acoustic wave resonator filter. Basically, two kind of resonance frequency is enough, however, for a wide range of filter design, three or more resonators having the different resonance frequency, respectively may be required. Additionally, if means of communication such as a cellular phone having both of the receiving function and the transmitting function is produced, it is necessary to manufacture a duplexer with a transmitting filter corresponding to the transmitting frequency and a receiving filter corresponding to the receiving frequency. Since the bulk acoustic wave resonator resonates at the half length of the frequency equal to the whole film thickness of the diaphragm structure, the resonance frequency of the bulk acoustic wave resonator is uniquely determined based on the whole film thickness of the diaphragm structure, and each acoustic velocity of the underlayer material, the bottom electrode layer material, the piezoelectric layer material and the top electrode layer material. That is to say, the resonance frequency of the bulk acoustic wave resonator can be controlled by changing the whole film thickness of the diaphragm structure. Thus if a bulk acoustic wave resonator filter is formed on the single substrate, the whole film thickness of the diaphragm structure should be changed for each bulk acoustic wave resonator. However, the present inventors found the following problems as the result of the consideration of the above mentioned conventional art.

In the conventional art disclosed in the non-patent document 1, the silicon etching process is employed to form the cavity at the position corresponding to the stacked resonator on the substrate. It would appear that the etching process is a wet etching according to the consideration by the present inventors. Therefore, the opening area of the cavity on the rear face of the substrate is enlarged so that it is not appropriate to downsize the bulk acoustic wave resonator.

In the conventional art disclosed in the patent document 1, the orientation of the piezoelectric layer is deteriorated due to affect by the surface condition of the sacrificial layer so that it is difficult to obtain an excellent resonance characteristic in the bulk acoustic wave resonator. In the conventional art disclosed in the patent document 2, the number of the process to form the bulk acoustic wave resonator is increased so that the production cost is increased.

In the conventional art disclosed in the non-patent document 2 or the patent document 3, since the dry etching is employed to form an air gap at the position corresponding to the stacked resonator on the substrate, the stacked resonator on direct upright of the substrate is damaged by etching so that the film thickness of the staked resonator is changed thereby the resonance frequency may be shifted.

In the conventional art disclosed in the patent document 3, the Si(111) substrate is employed to produce the bulk acoustic wave resonator. However, the Si(100) substrate is preferable in terms of the etching rate of the substrate and the cost such as the price of the substrate. Additionally, for a manufacturing technology to integrate the bulk acoustic wave resonator and a CMOS high frequency integrated circuit on a single substrate, since the Si(100) substrate is applied to the current CMOS high frequency integrated circuits, the Si(100) substrate may be preferable also in terms of the preferred CMOS characteristic.

The representative embodiment of the present invention is as follows. The bulk acoustic wave resonator according to the present invention comprises a substrate including a first surface, a second surface opposite to the first surface, which is provided with a first air gap opening at the first surface and having tapered shape, a second air gap opening at the second surface, having generally vertical shape to the second surface and connecting to the first air gap, and a stacked resonator having a stacked structure and placed on the first surface of the substrate such that a portion of the stacked resonator is overlapped with the first aperture. A Si(100) substrate is appropriate for the above mentioned substrate. Additionally, the stacked resonator has a diaphragm structure in which a bottom electrode, a top electrode and a piezoelectric film are stacked. Further, an underlayer may be included between the bottom electrode and the substrate.

The bulk acoustic wave resonator filter according to the present invention comprises a plurality of bulk acoustic wave resonators formed on a single substrate, and an input terminal and an output terminal connected each other through the plurality of bulk acoustic wave resonators, wherein at least one of the plurality of bulk acoustic wave resonators comprises a first air gap including a first aperture opening at a first surface of a substrate and having a tapered shape, and a second air gap including a second aperture opening at a second surface opposite to the first surface, having a generally vertical shape to the second surface and connecting to the first air gap, and a stacked resonator placed on the first surface such that a part of the stacked resonator is overlapped with the first aperture and having a stacked structure.

The semiconductor integrated circuit device according to the present invention comprises a front-end having a bulk acoustic wave resonator filter including a plurality of bulk acoustic wave resonators to selectively pass signals within a desired frequency band, and high frequency circuits including a field effect transistor, wherein the front-end and the high frequency circuit are integrated on the Si(100) substrate, wherein at least one of the plurality of bulk acoustic wave resonators comprises a first air gap including a first aperture opening at a first surface of a substrate and having a tapered shape, a second air gap including a second aperture opening at a second surface opposite to the first surface, having a generally vertical shape to the second surface and connecting to the first air gap, and a stacked resonator placed on the first surface such that a portion of the stacked resonator is overlapped with the first aperture and having a stacked structure.

The high frequency module according to the present invention comprises a first terminal, a first bulk acoustic wave resonator filter having a input terminal connected to the first terminal, a second bulk acoustic wave resonator filter having an output terminal connected to the first terminal, a second terminal connected to an output terminal of the first bulk acoustic wave resonator filter, and a third terminal connected to an input terminal of the second bulk acoustic wave resonator filter, wherein at least one of the first bulk acoustic wave resonator filter and the second bulk acoustic wave resonator filter include a bulk acoustic wave resonator comprises a substrate including a first surface, a second surface opposite to the first surface, a first air gap including a first aperture opening the first surface and having a tapered shape, and a second air gap including a second aperture opening at the second surface and having a generally vertical shape to the second surface, and a stacked resonator placed on the first surface such that a portion of the stacked resonator is overlapped with the first aperture and having a stacked structure.

The method of manufacturing a balk acoustic wave resonator according to the present invention comprises the following steps: forming a first electrode layer on a first surface of a substrate having the first surface and a second surface opposite to the first surface; forming a piezoelectric layer having a portion stacked on the first electrode layer; forming a second electrode layer having a portion staked on the piezoelectric layer; dry-etching the substrate from the second surface up to the distance shorter than the substrate thickness in a first direction determined based on the direction to which the first electrode layer and the second electrode layer are staked; and wet-etching the substrate from the second surface up to the distance determined based on the difference between the substrate thickness in the first direction and the etched distance by the dry etching.

According to the present invention, the bulk acoustic wave resonator and the bulk acoustic wave resonator filter can be downsized. Additionally according to the present invention, the frequency accuracy of the bulk acoustic wave resonator and the bulk acoustic wave resonator filter can be improved so that the yield is increased.

DETAILED DESCRIPTION OF THE PREFERRED EMBODIMENTS

Preferred embodiments of the present invention will be described in detail with reference to the attached drawings.

(Embodiment 1)

Figure 1:
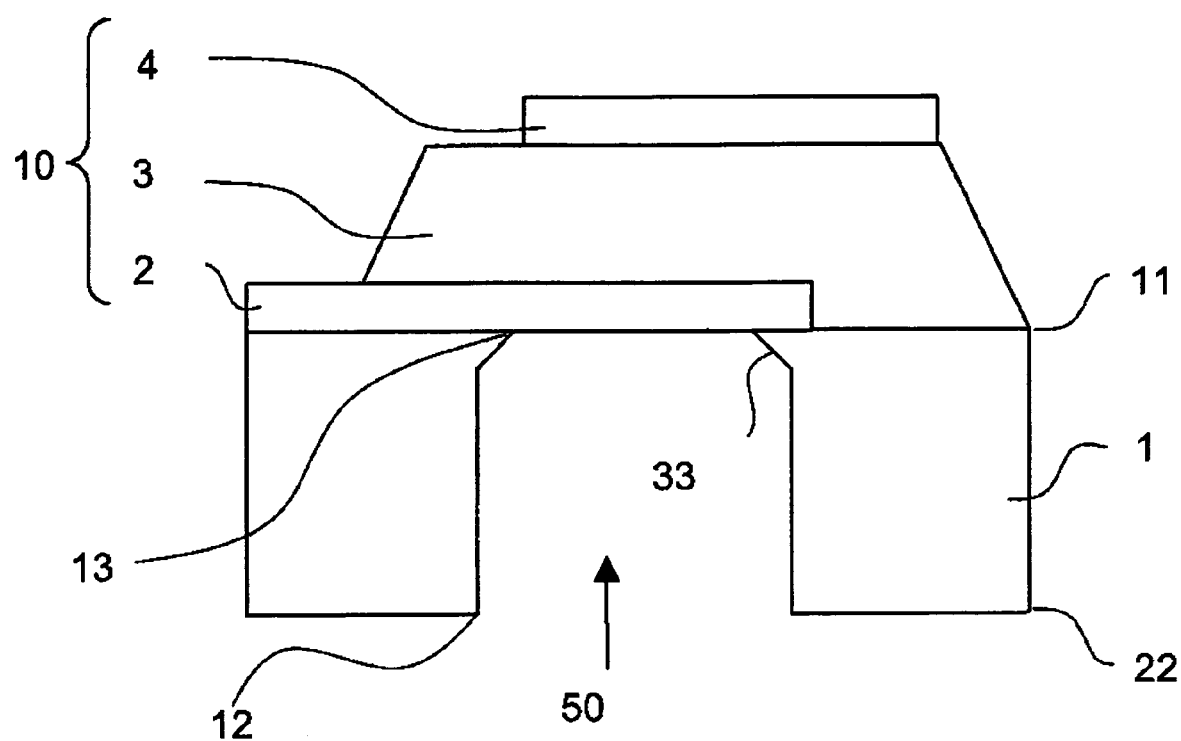
FIG. 1 is a sectional view of the embodiment 1 of the bulk acoustic wave resonator according to the present invention.

FIG. 1 is a sectional view of the embodiment 1 of the bulk acoustic wave resonator according to the present invention. A substrate 1 to form the bulk acoustic wave resonator of FIG. 1 is a single crystal Si (100) substrate having a first surface 11 equivalent to a (100) plane and a second surface 22 opposite to the first surface. A stacked resonator 10 including a first electrode layer 2 in contact with the first surface 11, a piezoelectric layer 3 overlaying the first electrode layer 2 and a second electrode layer 4 overlaying the piezoelectric layer 3 is provided on the first surface 11 of the substrate 1. An air gap 50 is formed through the substrate 1 in the area corresponding to the stacked resonator 10 on the substrate 1. The stacked resonator 10 has a diaphragm structure in which the piezoelectric layer 3 is sandwiched between the first electrode layer and the second electrode layer in the stacked direction. The first electrode layer and the second electrode layer is a bottom electrode layer and a top electrode layer, respectively in the diaphragm structure according to the present embodiment. The air gap 50 has an aperture 13 and an aperture 12 on the first surface 11 and the second surface 22 on the substrate 1, respectively. The air gap opening at the first surface 11 has a tapered shape 33, and the air gap opening at the second surface 22 has a generally vertical shape to the first surface 11. As evidenced by that the air gap 50 penetrates through the substrate 1, the air gap having the generally vertical shape and the air gap having the tapered shape are connected without interrupting therebetween.

In the bulk acoustic wave resonator according to the present embodiment, for example, the first electrode layer 2 is made from a (110)-oriented structure Mo having the thickness of 400 nm, the piezoelectric layer 3 is made from a (002)-oriented structure AlN having the thickness of 950 nm, and the second electrode layer 4 is made from a (110)-oriented structure Mo having the thickness of 400 nm. The substrate 1 being a Si(100) substrate has the thickness of 200 μm. With respect to the shape of the air gap 50 in the bottom area of the staked resonator 10, the air gap from second surface 22 within 180 μm in the substrate 1 has a generally vertical shape to the first surface 11 of the substrate 1, and the air gap from the second surface 22 over 180 μm in the substrate 1 has a tapered shape 33. The first electrode layer 1 is exposed to the air gap 50 thereby to be isolated from the bulk acoustic wave by the air.

Figure 2:
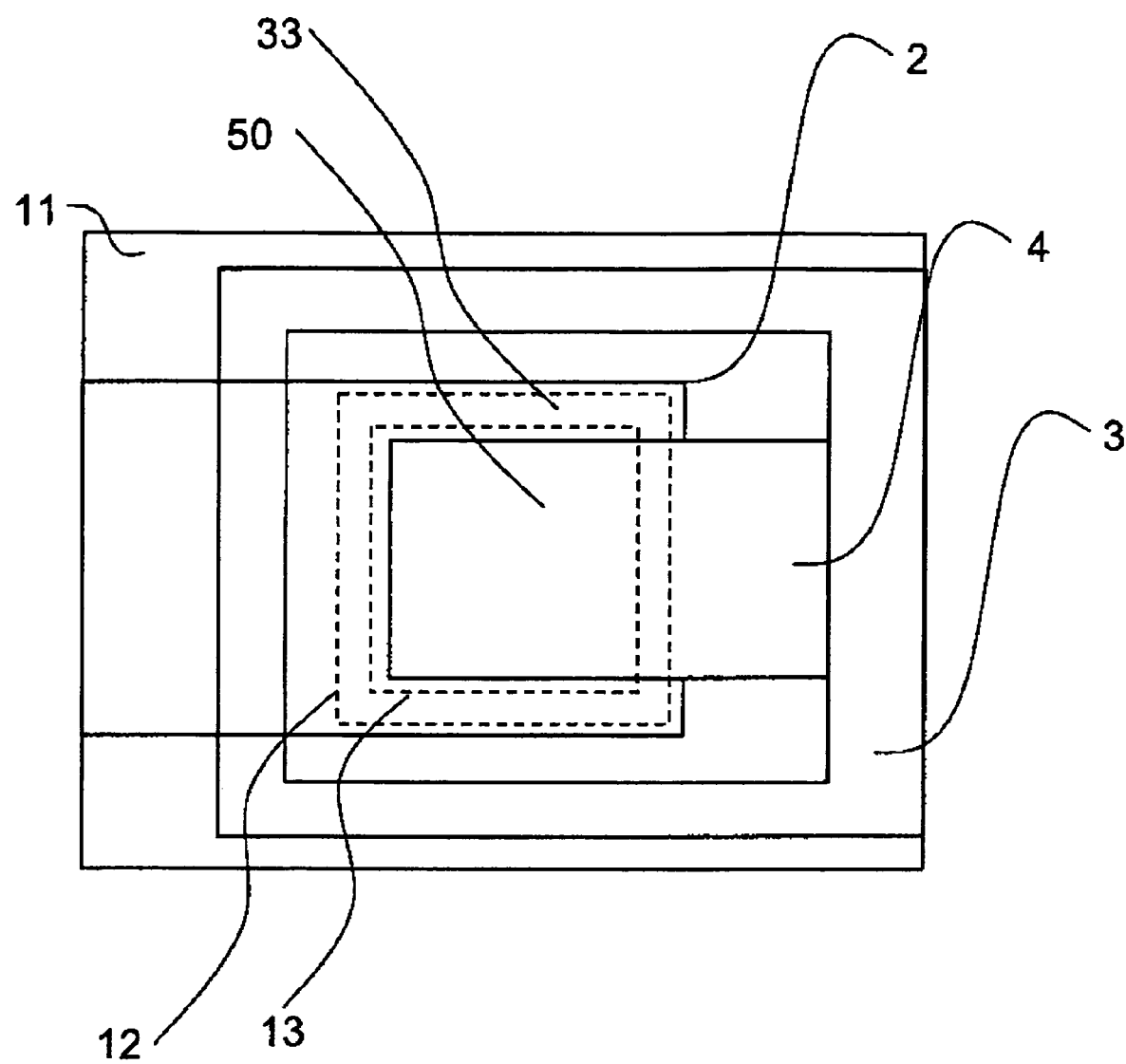
FIG. 2 is a top view of the embodiment 1 of the bulk acoustic wave resonator according to the present invention.

FIG. 2 is a top view of the bulk acoustic wave resonator according to the present embodiment of FIG. 1, viewing from the second electrode layer 4 to the direction of the substrate 1. The aperture 13 opening at the first surface 11 is smaller than the first electrode layer 2 corresponding to the stacked resonator 10 in the stacked direction in FIG. 2. However, a portion of the aperture 13 may be not overlapped with the first electrode layer 2 in the stacked direction, and it is not limited to the present embodiment.

According to the present embodiment, since the major part of the air gap 50 of the substrate 1 has the generally vertical shape and a part of the air gap 50 has the tapered shape, the bulk acoustic wave resonator can be downsized than when the whole air gap 50 has the tapered shape.

Next, an example of the manufacturing method of the bulk acoustic wave resonator of the present embodiment is described in reference to FIG. 3. FIG. 3(B): Depositing a (110)-oriented structure Mo of 400 nm as a first electrode layer 2 on the first surface 11 of a substrate 1 being the single crystal Si (100) substrate. FIG. 3(C): Patterning it to obtain an electrode in desired area. FIG. 3(D): Depositing a (002)-oriented structure AlN of 950 nm as a piezoelectric layer 3, subsequently, depositing a (110)-oriented structure Mo of 400 nm as a second electrode layer 4. FIG. 3(E): Patterning the Mo as the second electrode layer 4 and patterning the AlN as the piezoelectric layer 3 to form the stacked resonator 10. FIG. 3(F): Forming a resist as an etching mask material 40 along the area corresponding to the bulk acoustic wave resonator on the second surface 22 of the substrate 1 in order to form an air gap 50 in the bottom area of the bulk acoustic wave resonator. FIG. 3(G): Dry-etching the substrate 1 from the second surface 22 up to 180 μm in depth with Deep-RIE to form an air gap having the generally vertical shape to the first surface 11.

Figure 3A:
FIG. 3 is a cross sectional schematic view of an example of the manufacturing method of the bulk acoustic wave resonator in order of process of FIG. 1.
Figure 3B:
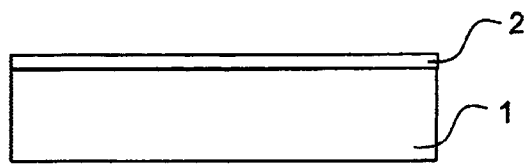
Figure 3C:
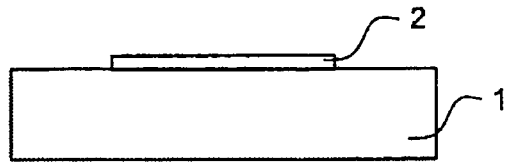
Figure 3D:
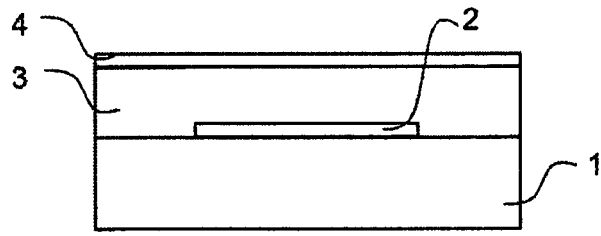
Figure 3E:
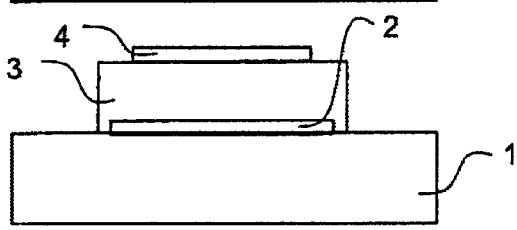
Figure 3F:
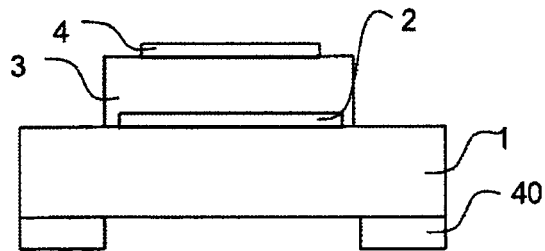
Figure 3G:
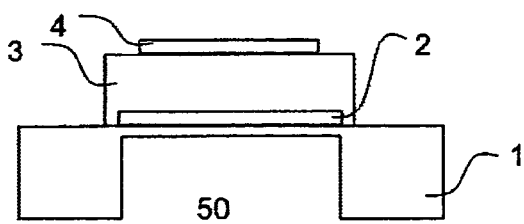
Figure 3H:
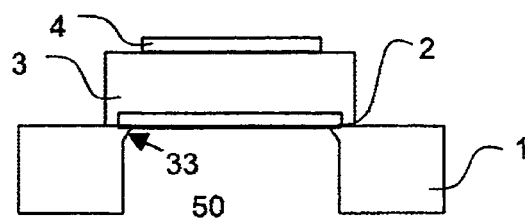

FIG. 3(H): Wet-etching the substrate 1 from the second surface 22 over 180 μm until the first electrode layer 2 is exposed so that the air gap 50 is formed. That is to say, in order to form the air gap 50, the substrate is dry-etched from second surface 22 up to the depth shorter than the substrate thickness, and the remaining portion of the air gap 50 not etched by the dry etching, i.e. the distance determined based on the difference between the substrate thickness and the depth of the dry etching is etched by the wet etching. In case of the Si(100) substrate is used as the present embodiment, the anisotropic wet etching among the wet etching with the KOH solution heated to 60□ is preferable. Thus when the Si(100) substrate is etched using the well-known anisotropic wet etching method with the KOH solution, the etched inner surface of the air gap becomes a (111) plane.

Figure 6:
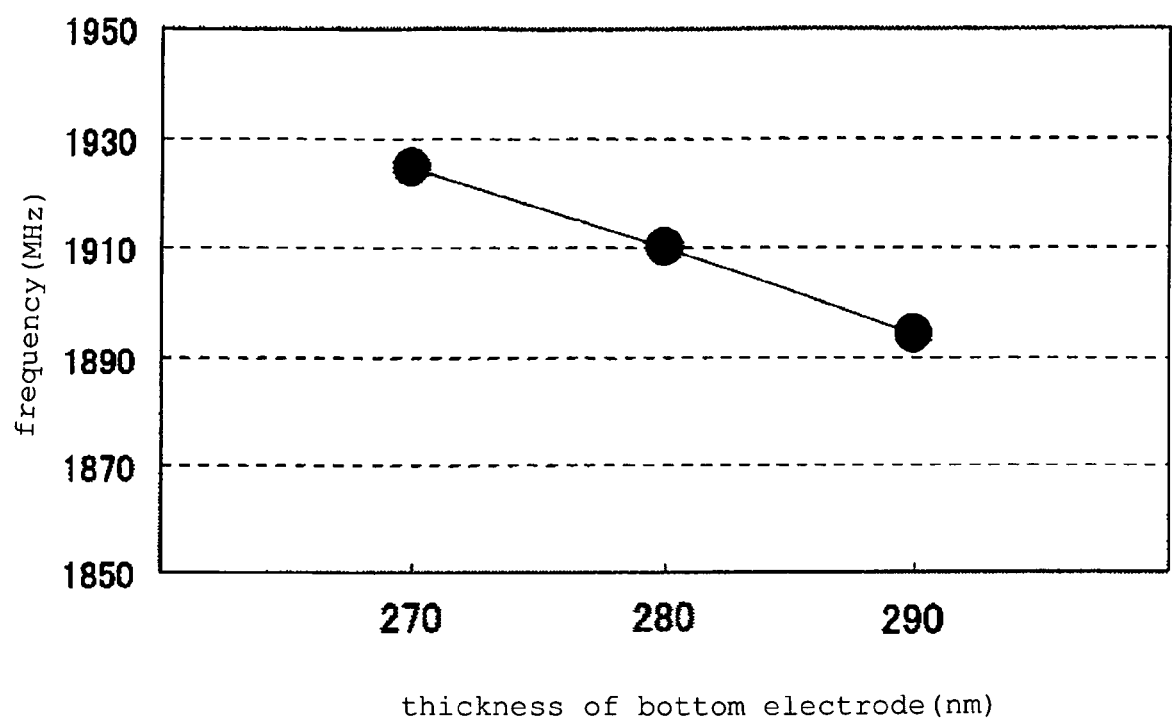
FIG. 6 represents the amount of the frequency shift by changing the film thickness due to the damage of the bottom electrode by etching.

According to the present embodiment, the wet process is applied at the final stage of the etching so that the etching damage to the first electrode layer can be reduced and the frequency shift due to the change of the thickness of the stacked resonator 10 can be substantially reduced. FIG. 6 represents an example of the result of the simulation of the frequency shift due to the change of the thickness of the stacked resonator 10. The effect of the present embodiment is described in reference to FIG. 6. According to the relationship between the change of the thickness of the bottom electrode and the amount of the frequency shift, when the thickness of the bottom electrode changes by about 10 nm, the frequency is shifted by 18 MHz and the etching damage to the first electrode layer 2 is not negligible. In the same way, in view of FIG. 6, when the thickness of the electrode layer changes by 10 nm of the whole thickness of 1750 nm of the staked resonator, the frequency is shifted by 18 MHz. Therefore, the etching damage to the first electrode layer 2 can be reduced and the frequency shift due to the change of thickness of the stacked resonator 10 can be substantially reduced so that the yield can be further increased and also the cost can be reduced in the present embodiment. Additionally, according to the present embodiment, since the first surface 2 as the bottom electrode is not limited to the material unable to be etched by the dry etching, the bottom electrode material can be selected among various options. Therefore, the appropriate material can be selected thereby the resonance characteristic of the bulk acoustic wave resonator may be improved.

The material for the first electrode layer 2 and the second electrode layer 4 is preferably Mo and W. Since Mo and W have high acoustic velocity, the acoustic wave is efficiently propagated. In addition to them, Ta, Ni, Nb, Au, Pt, Cu, Pd and Ti can be applied to the material for the first electrode layer 1 and the second electrode layer 2. Additionally, ZnO, PZT, PbTiO$_3$ and BaTiO$_3$ except for AlZ can be applied to the material for the piezoelectric layer. Incidentally, each of the above mentioned thickness is illustrative only, and it can be appropriately changed depending on the material used and the resonance frequency required. The manufacturing method is also illustrative only, and it can be appropriately changed. The diaphragm structure of the present bulk acoustic wave resonator can be manufactured within 300 nm–7 μm in thickness by the current technology and the applicable resonance frequency is within 0.5 GHz–10 GHz.

In the foregoing specification, the embodiment when the Si(100) substrate is used has been described, however, the Si(111) substrate as the substrate 1 may be applied. In this case, the wet process is also applied at the final stage of the etching to form the air gap 50 so that the etching damage to the first electrode layer is reduced and the frequency shift due to the change of the thickness of the stacked resonator 10 can be substantially reduced as well as the above described embodiment. In the wet process at the final stage of the etching, the isotropic wet etching with a HF solution is preferable for example. Additionally, when the Si(111) substrate is used, it facilitates to be integrated with a high frequency integrated circuit including a bipolar transistor as described later.

(Embodiment 2)

Figure 4:
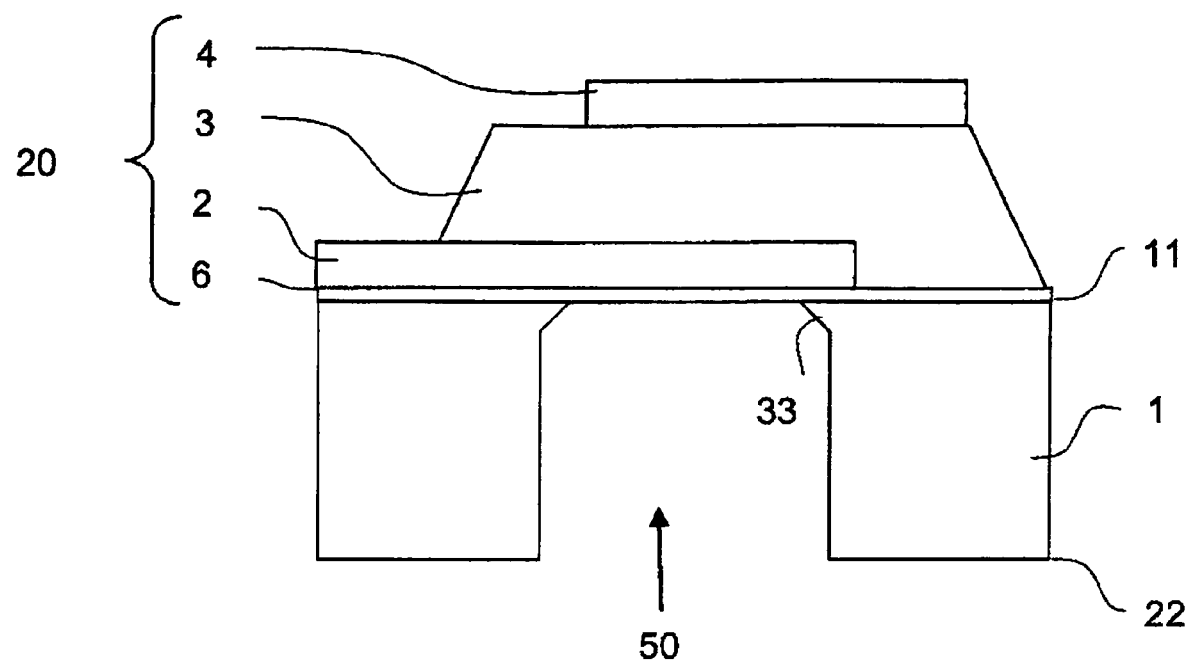
FIG. 4 is a sectional view of the embodiment 2 of the bulk acoustic wave resonator according to the present invention.
Figure 5A:
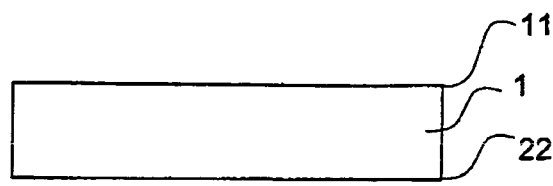
FIG. 5 is a cross sectional schematic view of an example of the manufacturing method of the bulk acoustic wave resonator in order of process of FIG. 4.
Figure 5B:
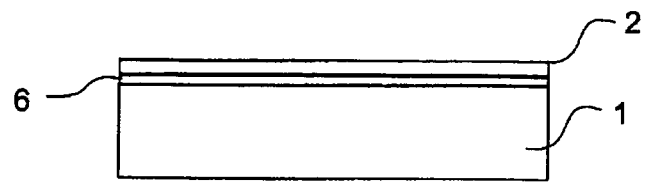
Figure 5C:
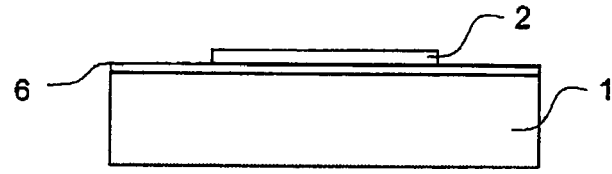
Figure 5D:
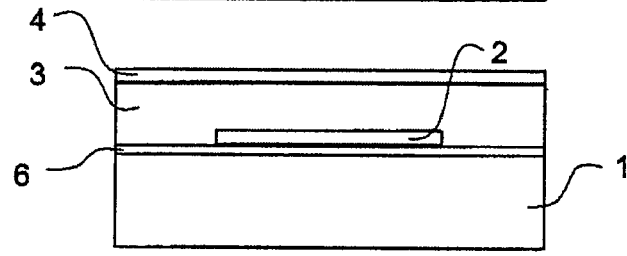
Figure 5E:
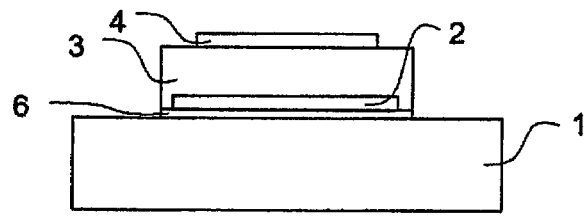
Figure 5F:
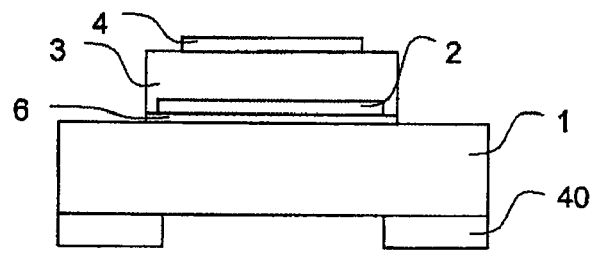
Figure 5G:
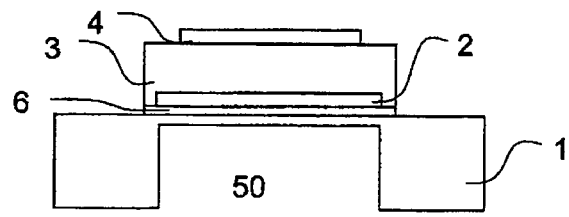
Figure 5H:
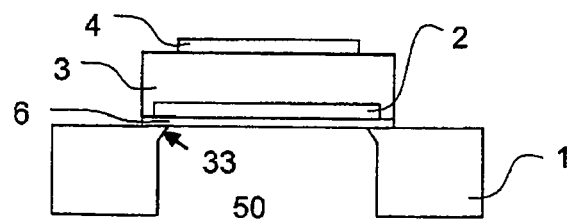

FIG. 4 is a sectional view of another embodiment of the bulk acoustic wave resonator according to the present invention. The substrate 1, the first electrode layer 2, the piezoelectric layer 3 overlaying the first electrode layer 2, the second electrode layer 4 overlaying the piezoelectric layer 3 and the air gap 50 formed in the substrate 1 of FIG. 4 are same as the embodiment 1. The difference from the embodiment 1 is that an underlayer 6 in contact with the first surface 11 of the substrate 1 is provided between the substrate 1 and the first electrode layer 2. At least a portion of the underlayer 6 is positioned to overlap with the aperture of the air gap opening at the first surface 11 and having the tapered shape in the stacked direction. The underlayer 6 is exposed to the air gap 50 thereby to be acoustically isolated from the electrical signal by the air.

In the bulk acoustic wave resonator of the present embodiment, for example, the underlayer 6 is made from the SiC having the thickness of 10 nm. The material, the oriented structure and the thickness of the substrate 1, the first electrode layer 2, the piezoelectric layer 3 and the second electrode 4, and the shape of the air gap 50 are same as the embodiment 1.

According to the present embodiment, since the major part of the air gap 50 of the substrate 1. has the generally vertical shape and a part of the air gap 50 has the tapered shape, the bulk acoustic wave resonator can be downsized than when the whole air gap 50 has the tapered shape as well as the embodiment 1. Additionally, the AlN as the underlayer is applied in the Si(100) substrate for example so that the piezoelectric layer have the sufficient (002)-oriented structure thereby the excellent resonance characteristic can be obtained from the good film quality of the piezoelectric layer.

FIG. 5 is an example of the manufacturing method of the bulk acoustic wave resonator of the present embodiment. The difference from the manufacturing method of the embodiment 1 is that FIG. 5(B): Depositing SiC of 10 nm as an underlayer 6 on the substrate 1 being the Si(100)substrate, subsequently, depositing Mo of 400 nm as the first electrode layer 2 and FIG. 5(E)Patterning the underlayer 6 are further included. The other steps are same as the embodiment 1.

According to the present embodiment, the wet process is applied at the final stage of the etching so that the etching damage to the underlayer 6 is reduced and the frequency shift due to the change of the thickness of a stacked resonator 20 can be substantially reduced. Additionally, the yield is further increased and the cost can be reduced.

The material for the underlayer is preferably selected among AlN, Al$_2$O$_3$, SiC, SiO$_2$, and Si$_3$N$_4$. Since the underlayer should support the sandwich structure in the cavity, its mechanical strength is preferably enhanced. In terms of that, AlN, Al$_2$O$_3$, and SiC are preferable. Additionally, ZnO, PZT, PbTiO$_3$ and BaTiO$_3$ except for them can be applied as the material. Incidentally, each of the above mentioned thickness is illustrative only, and it can be appropriately changed depending on the material used and the resonance frequency required. The manufacturing method is also illustrative only, and it can be appropriately changed.

(Embodiment 3)

Figure 7:
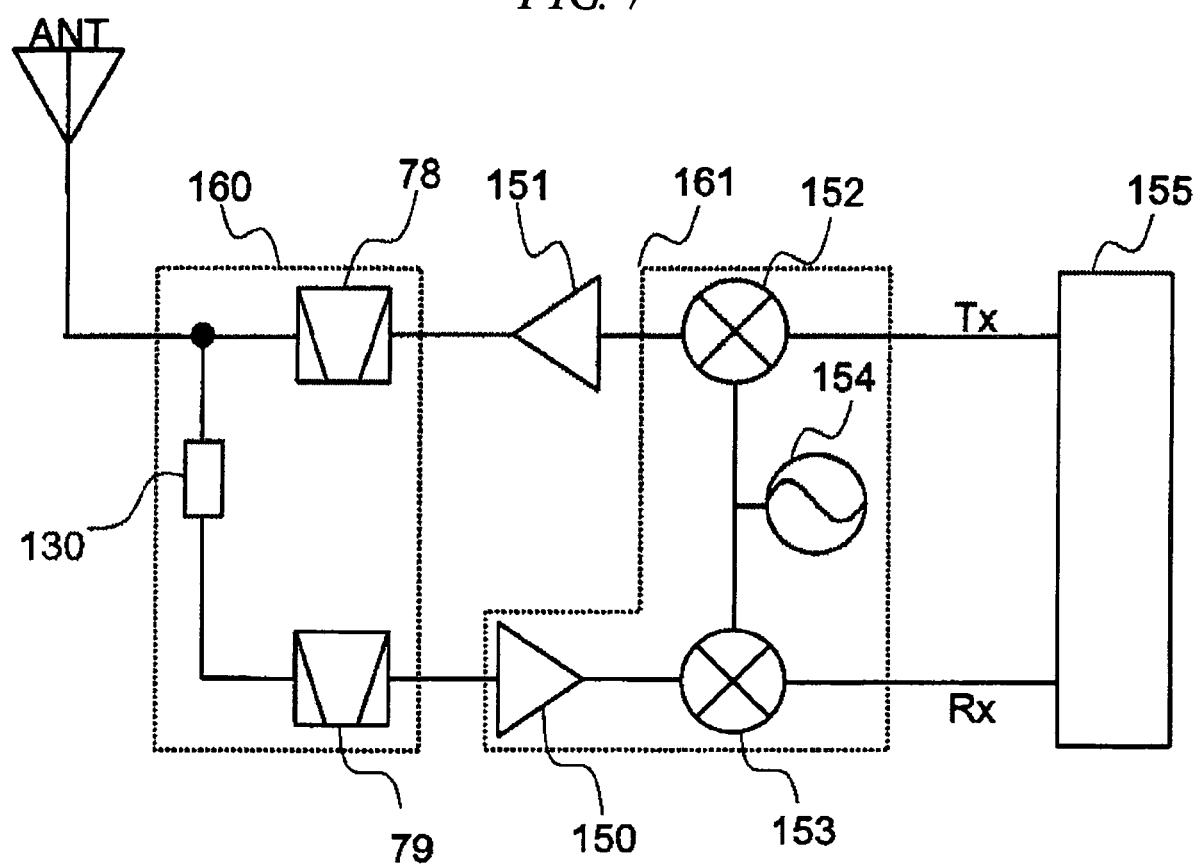
FIG. 7 is a circuit diagram of the cellular phone applied the bulk acoustic wave resonator filter according to the present invention.

Now, an embodiment that the filter using the bulk acoustic wave resonator according to the present invention is formed on the single substrate is described. FIG. 7 is a circuit diagram of the cellular phone applied the filter using the bulk acoustic wave resonator according to the present invention. The detailed configuration of the filter is described later.

In FIG. 7, a high frequency received signal Rx received from an antenna ANT is passed through a phase shifter 130 and inputted into a low noise amplifier 150 to be amplified through a receiving filter 79 to remove image frequency signals and selectively pass frequency signals in a predetermined receiving band. The high frequency received signal Rx amplified by the low noise amplifier 150 is transmitted to a baseband unit 155 to convert to baseband through a receiving mixer 153.

Meanwhile, a high frequency transmitting signal Tx transmitted from the baseband unit 155 is inputted into a power amplifier 151 to be amplified through a transmitting mixer 152 to produce a modified radio frequency signal. The high frequency transmitting signal Tx amplified by the power amplifier 151 is radiated as radio wave from the antenna through a transmitting filter 78 to selectively pass transmitting signals within a predetermined transmitting frequency band.

The circuit configuration of FIG. 7 includes the phase shifter 130 to enable to share the antenna by a receiver and a transmitter, a synthesizer 154 and the baseband unit 155 to process the received signal and the transmitting signal. A front-end 160 includes the receiving filter 79, the transmitting filter 78 and the phase shifter 130.

Figure 8:
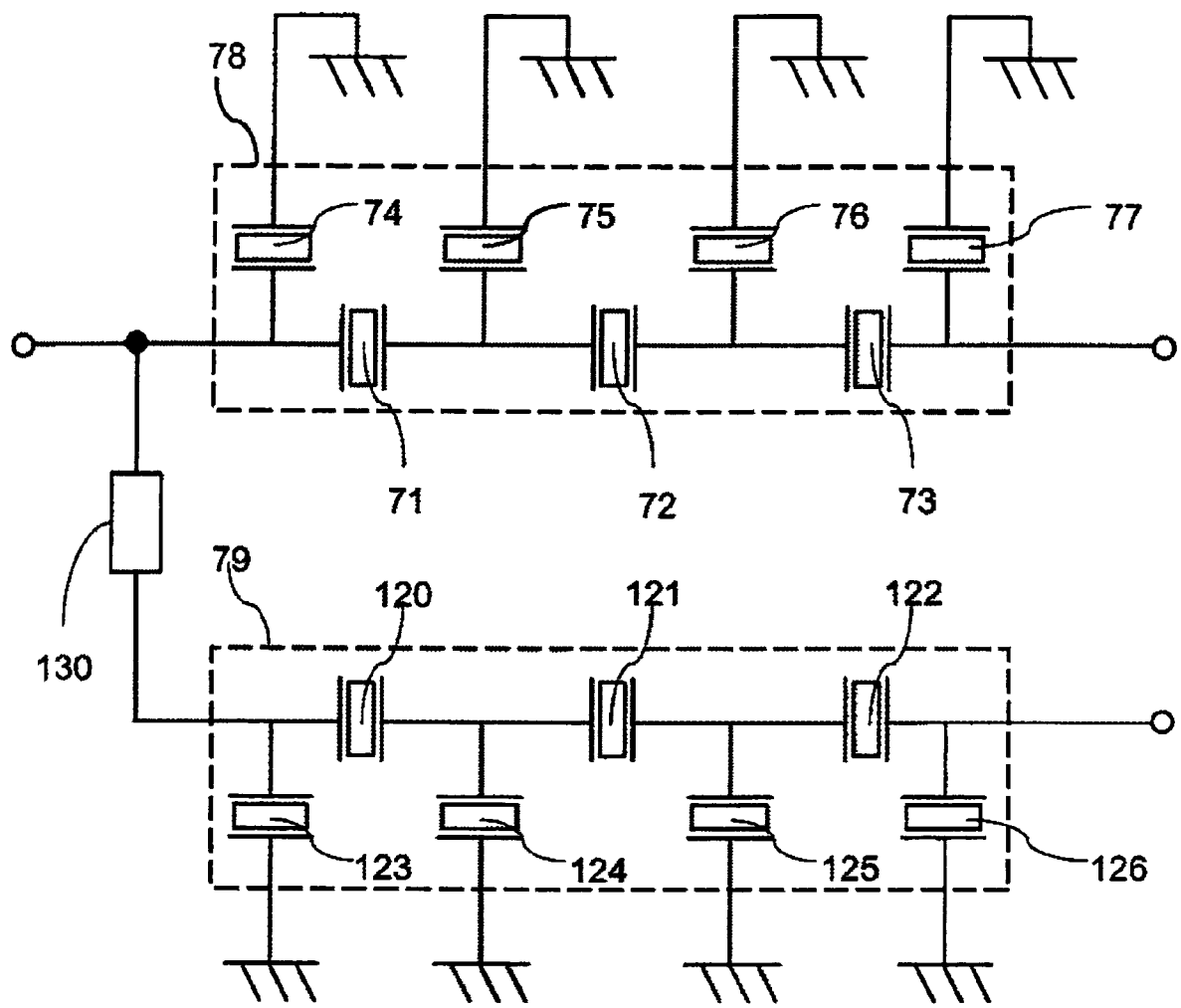
FIG. 8 is circuit diagram of the front-end including the transmitting filter and the receiving filter with the array of the bulk acoustic wave resonator filters according to the present invention.

FIG. 8 is an example of the circuit diagram of the front-end 160 of FIG. 7. In FIG. 8, each of the transmitting filter 78 and the receiving filter 79 is composed of the assembly of a plurality of bulk acoustic wave resonators according to the present invention. The transmitting filter 78 is composed of the array of the bulk acoustic wave resonator 71–77 surrounded by the broken line, and the receiving filter 79 is composed of the array of the bulk acoustic wave resonator 120–126 surrounded by the broken line, respectively. The transmitting signal is inputted from a terminal connected to the bulk acoustic wave resonator 73 and 77 constituting the transmitting filter 78 and outputted from a terminal connected to the bulk acoustic wave resonators 71 and 74. Meanwhile, the received signal from the antenna is passed through the phase shifter 130, inputted into the bulk acoustic wave resonators 120 and 123 constituting the receiving filter 79 and outputted from a terminal connected to the bulk acoustic wave resonators 122 and 126. In the transmitting filter 78, a series-arm resonator is composed of the bulk acoustic wave resonators. 71–73, and a shunt-arm resonator is composed of the bulk acoustic wave resonators 74–77. In the receiving filter 79, a series-arm resonator is composed of the bulk acoustic wave resonators 120–122, and a shunt-arm resonator is composed of the bulk acoustic wave resonators 123–126.

Incidentally, the array of the resonators is illustrative only, and since the array of the resonators is determined based on the desired filter property, it is not limited to the array according to the present embodiment. Additionally, a circuit used as the phase shifter 130 may have the well-known configuration. It may be composed of an inductor and a conductor or a transmission line of length λ/4.

Figure 9:
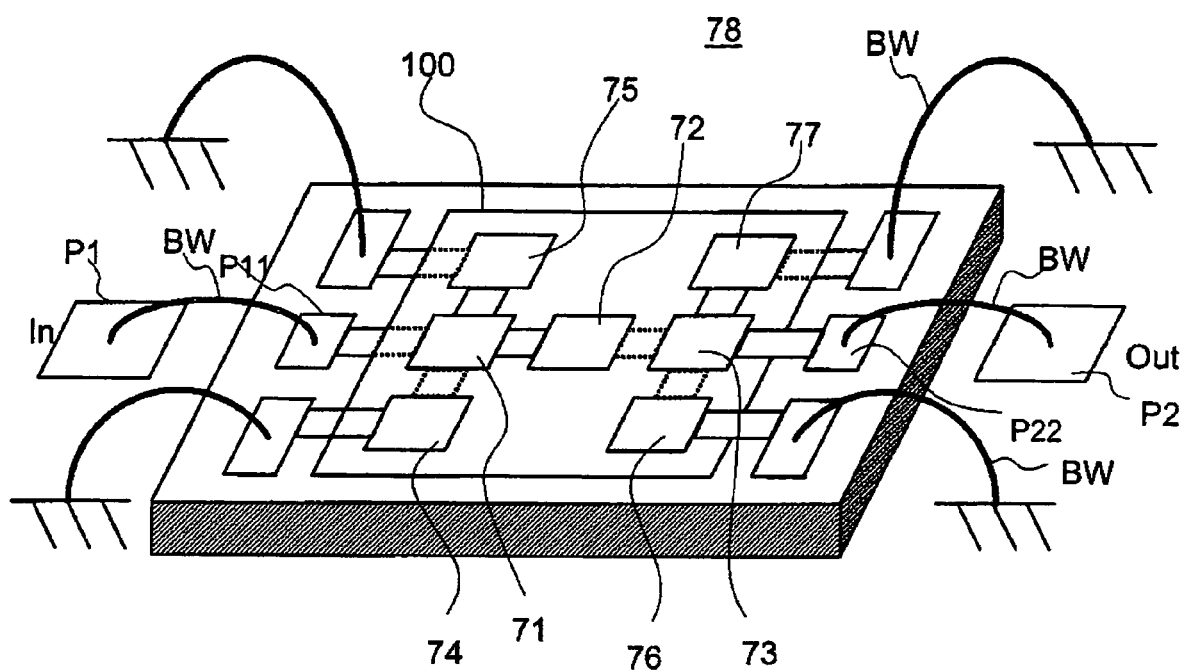
FIG. 9 is a schematic external perspective view when the transmitting filter using the bulk acoustic wave resonator according to the present invention is formed on a single substrate.

FIG. 9 is an example of the schematic external perspective view when the transmitting filter 78 of FIG. 8 is formed on a single substrate. The bulk acoustic wave resonators 71–77 has the structure as well as the above described embodiment 1 or 2. It includes the top electrode, the bottom electrode and the piezoelectric layer sandwiched therebetween. Where, the bulk acoustic wave resonators 71–77 are formed of rectangle. However, since the shape of the bulk acoustic wave resonator is determined based on the desired filter property, it is not limited to the rectangle. The series-arm resonator is composed of the bulk acoustic wave resonators 71–73, and the shunt-arm resonator is composed of the bulk acoustic wave resonators 74–77. In FIG. 9, the continuous lines connecting each bulk acoustic wave resonator represent wires connected to the top electrode layer. The dotted lines connecting to each bulk acoustic wave resonator represent wires connected to the bottom electrode layer. A rectangular area 100 is the piezoelectric layer. The reference alphanumeric character P2 indicates an input wiring pad to which the transmitting signal from the internal circuit (not shown in the figure) is transmitted. The input wiring pad is connected to an input terminal pad P22 of the filter connected to the bulk acoustic wave resonator 73 of the transmitting filter 78 through a bonding wire BW and further connected to an output terminal pad P11 of the filter through the bulk acoustic wave resonators 72 and 71 connected in series by an electrode wire. The output terminal pad P11 of the filter and a pad 1 connected to the antenna (not shown in the figure) are connected through the bonding wire BW. The wiring pad connected to the top electrode layer of the bulk acoustic wave resonators 74 and 76 and the wiring pad connected to the bottom electrode layer of the bulk acoustic wave resonator 75 and 77 are connected to a ground pad (not shown in the figure) though the bonding wire BW, respectively. Thus the transmitting filter 78 of the circuit diagram of FIG. 8 is formed on the single substrate.

According to the present embodiment, the bulk acoustic wave resonator filter is formed a single substrate so that the filter can be downsized and the cost can be reduced. Since the bulk acoustic wave resonators according to the present invention is used as a plurality of bulk acoustic wave resonators to form the filter, the frequency accuracy of the filter can be improved and the yield can be increased. Additionally, when the filter is applied to a cellular phone, the cellular phone can be downsized.

The embodiment of FIG. 9 represents when the bonding wire BW is used to connect the internal circuit (not shown in the figure) to the transmitting filter 78. However, another means such as bump bonding may be applied. Additionally, the input terminal P22 and the output terminal P11 may be connected to either of the top electrode or the bottom electrode of the bulk acoustic wave resonator, and it is not limited to be connected the top electrode as the present embodiment.

In the present embodiment, the case that the transmitting filter 78 is formed on the single substrate is described, however, the receiving filter 79 also may be formed on the single substrate. Additionally, the transmitting filter 78 and the receiving filter 79, or the front-end 160 including the transmitting filter 78 and the receiving filter 79 may be formed on the single substrate. Thereby the front-end and the cellular phone equipped with the front-end can be further downsized and the cost can be reduced. It will be applicable to be integrated with a high frequency integrated circuit at some future date. Incidentally, the bulk acoustic wave resonator filter is applied to the shingle-band cellular phone in the present embodiment, however, it can be also applied to a multi-band such as a dual-band, a triple-band and a quad-band cellular phone and it is not limited to the embodiment.

(Embodiment 4)

Next, the embodiment of the high frequency module using the bulk acoustic wave resonator according to the present invention is described. The present embodiment is that the front-end 160, a high frequency integrated circuit 161 and the power amplifier 151 are modularized as the chipset for cellular phones in the circuit configuration of FIG. 7.

According to the present embodiment, the function of the signal transmitter and receiver is modularized thereby the cellular phone equipped with thereof can be downsized and the cost can be reduced.

Incidentally, the bulk acoustic wave resonator is applied to the shingle-band cellular phone in the present embodiment, however, it can be also applied to a multi-band such as a dual-band, a triple-band and a quad-band cellular phone and it is not limited to the present embodiment.

(Embodiment 5)

Figure 10:
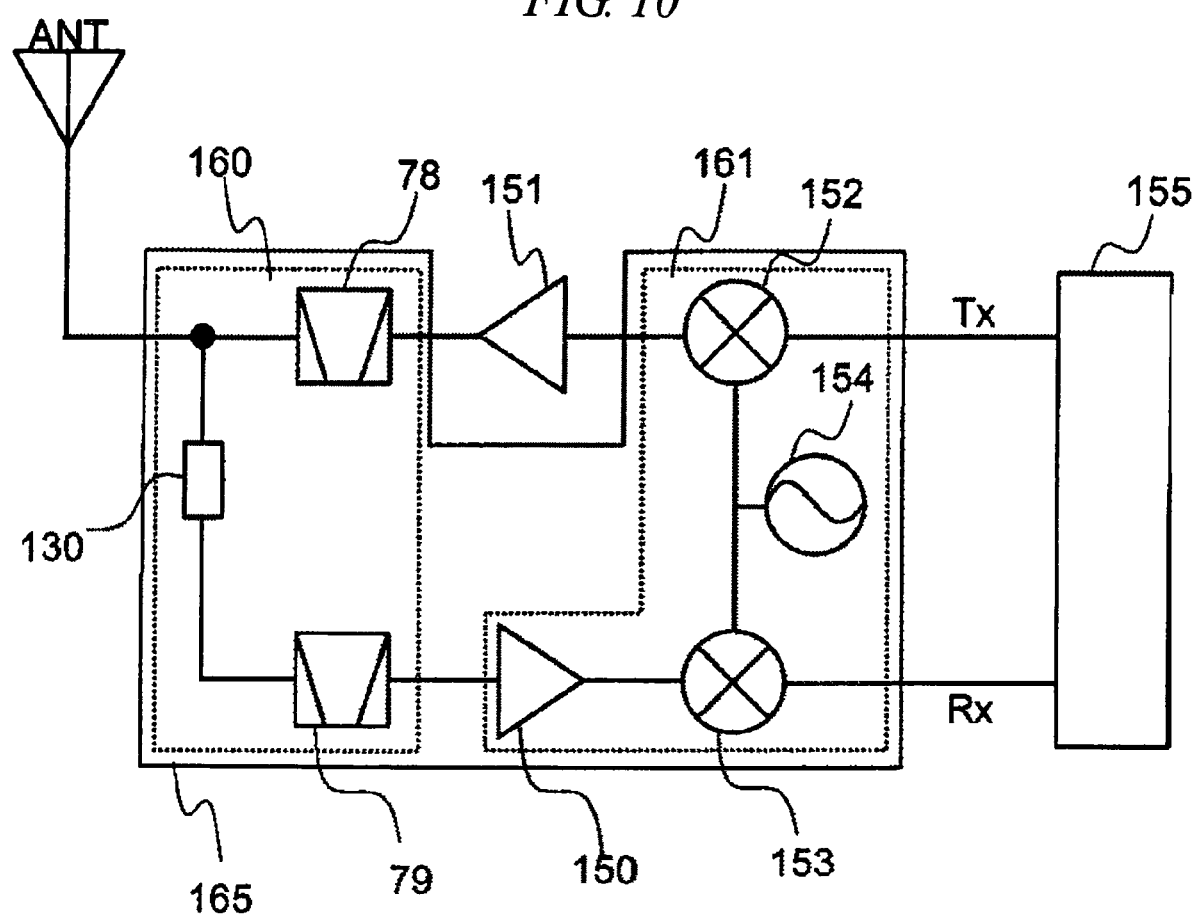
FIG. 10 is a block diagram when the bulk acoustic wave resonator filter according to the present invention and the CMOS high frequency integrated circuit are formed on a single substrate.

Now, the present embodiment that the bulk acoustic wave resonator filter according to the embodiment 1 or 2 and the CMOS high frequency integrated circuit are integrated on the single substrate is described. FIG. 10 is a block diagram when the acoustic wave resonator filter and the CMOS high frequency integrated circuit are formed on a single Si(100) substrate. The front-end 160 and the high frequency integrated circuit 161 are integrated on the single substrate in FIG. 10.

According to the present embodiment, an integrated semiconductor integrated circuit device 165 is achieved so that the functional blocks associated with the radio transmitter/receiver of the cellular phone can be put together in one integrated circuit. Additionally, since the wires to connect between the chips are not required thereby the packaging area can be significantly reduced than the configuration that the front-end and the high frequency integrated circuit are individual chips. Especially, the present embodiment is more easy to apply in wireless LAN and Bluetooth because the power amplifier 151 is not required for them. If the power amplifier 151 may be integrated at some future date, the assembly process to package the power amplifier 151 can be omitted.

Next, one example of the manufacturing process of the present embodiment that the filter using the bulk acoustic wave resonator according to the embodiment 1 or 2 and the CMOS high frequency integrated circuit are integrated on the Si(100) substrate is described in reference to FIG. 11. Firstly, in the manufacturing process of the CMOS high frequency integrated circuit, after an desired shaped aperture 81 is formed on an oxide film 90 formed on a N-type silicon substrate 80, FIG. 11(A): a p well 82 is formed by implanting boron ions. Next, an oxide film and a nitride film (not shown in the figure) are formed in a desired shape and boron ions are implanted, then, FIG. 11(B): a field oxide 83 is formed. Next, after the oxide film and the nitride film (not shown in the figure) are removed, FIG. 11(C): a gate oxide film 84 is formed.

Figure 11A:
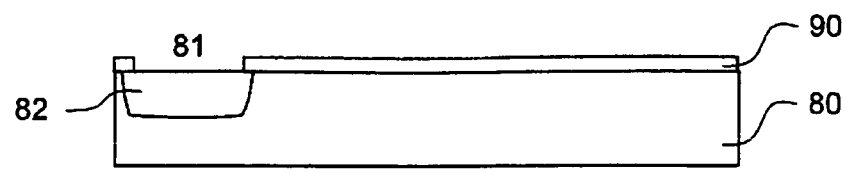
FIG. 11 is a cross sectional schematic view of an example of the method of manufacturing the bulk acoustic wave resonator and the CMOS high frequency integrated circuit on a single substrate in order of process.
Figure 11B:
Figure 11C:
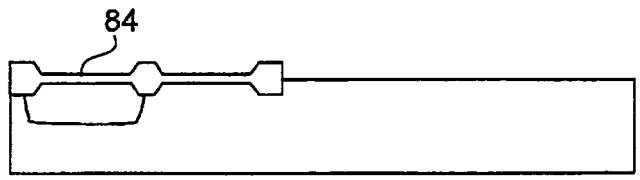
Figure 11D:
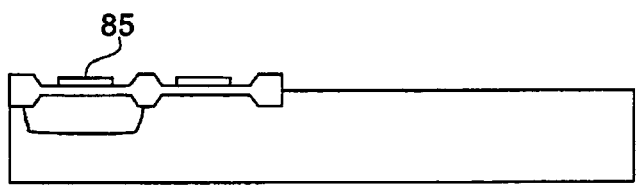
Figure 11E:
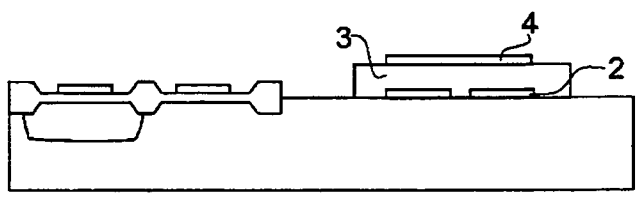
Figure 11F:
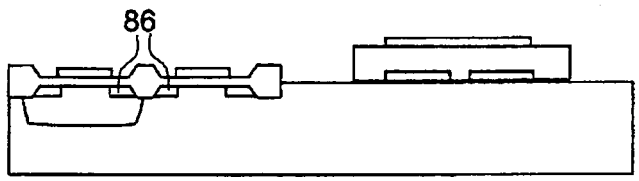
Figure 11G:
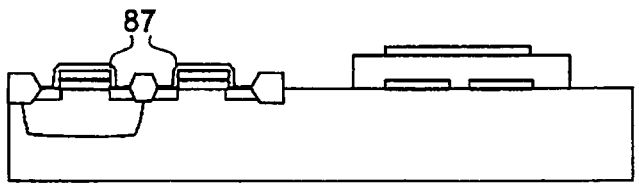
Figure 11H:
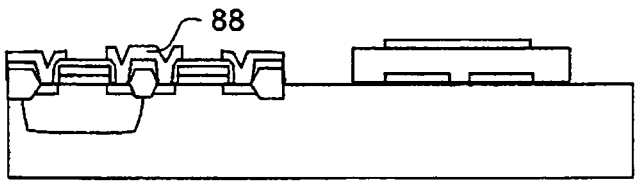
Figure 11I:
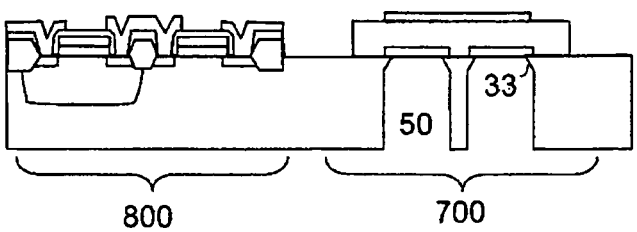
Figure 12:
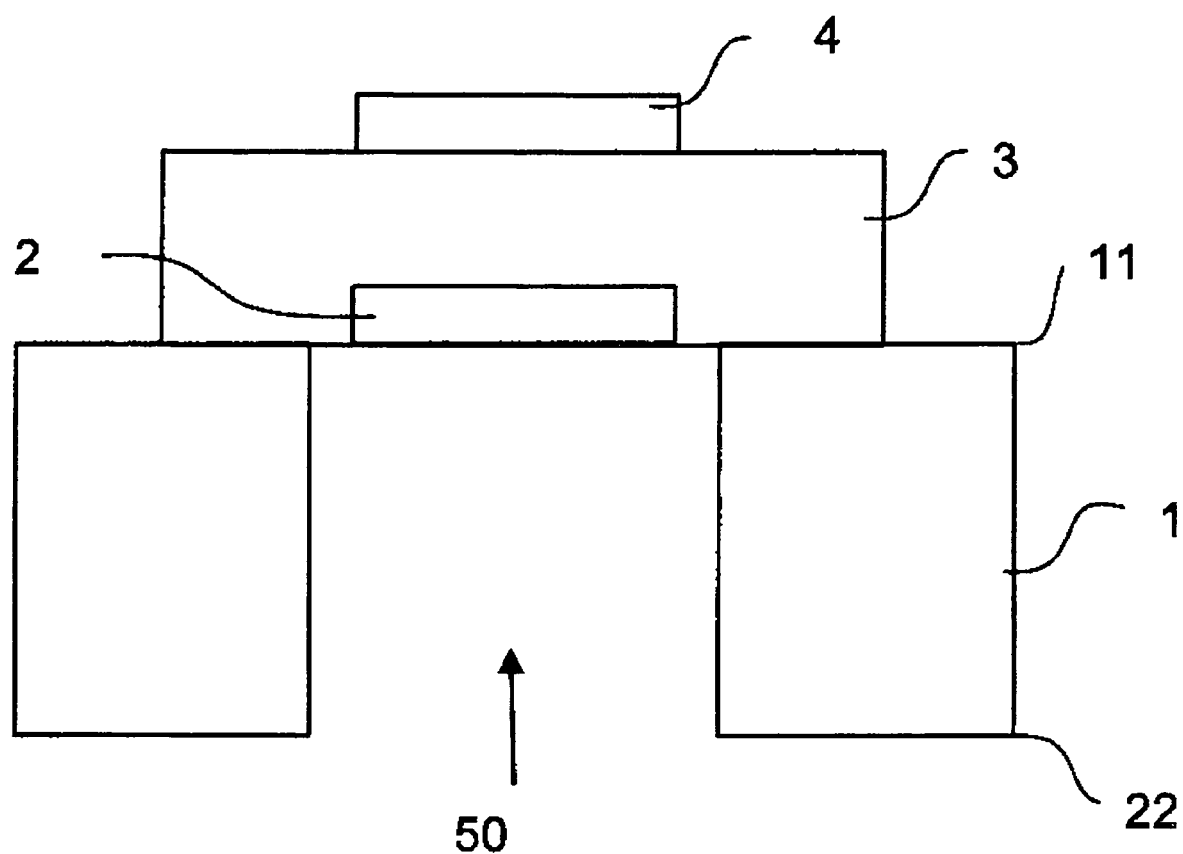
FIG. 12 is a cross-sectional view of the conventional bulk acoustic wave resonator.

Next, after boron ions are implanted in a desired shape, a polysilicon is formed, and after phosphorus is diffused, a polysilicon 85 is processed in a desired shape so that FIG. 11(D): a gate pattern is produced. After a gate is formed in the CMOS high frequency circuit, FIG. 11(E): the stacked resonator 10 composed of the first electrode film 2, the piezoelectric film 3 and the second electrode film 4 or the stacked resonator 20 composed of the underlayer 6, the first electrode film 2, the piezoelectric film 3 and the second electrode film 4 is formed in the manufacturing process of the balk acoustic wave resonator. Subsequently, in the manufacturing process of the CMOS high frequency integrated circuit, FIG. 11(F): arsenic ions are implanted in a desired shape and boron ions are implanted in a desired shape to form a source/drain 86. Then, FIG. 11(G): PSG as an interlayer dielectric 87 is formed. After a contact opening is formed, FIG. 11(H): a wiring layer 88 is formed. A CMOS high frequency circuit 800 is manufactured by the above described steps. Next, FIG. 11(I): The substrate is dry-etched from the second surface up to the depth shorter than the substrate thickness generally vertical to the first surface, and further wet-etched by the distance determined based on the difference between the substrate thickness and the depth of the dry etching to form the air gap 50 so that a bulk acoustic wave resonator filter 700 is manufactured.

According to the present embodiment, as above described embodiment 1 or 2, the wet process is applied at the final stage of the etching thereby the etching damage to the first electrode film can be reduced and the frequency shift due to the change of the thickness of the stacked resonator 10 or 20 can be substantially reduced. Especially, since the Si(100) substrate is used as the substrate, the anisotropic wet etching with the KOH solution can be applied as the wet process. Since the Si(100)substrate is used, the bulk acoustic wave resonator can be integrated with the CMOS high frequency integrated circuit on the single substrate so that the mobile communications terminal as represented by the cellular phone can be further downsized. Additionally, since the current CMOS high frequency integrated circuits employ the Si(100) substrate, the request that the Si(100) substrate is applied to the bulk acoustic wave resonator will be rapidly increased.

The application to the high frequency integrated circuit using CMOS transistors is described in the present embodiment, however, the bulk acoustic wave resonator also can be applied to a field effect transistor such as a MIS and a bipolar transistor and it is not limited to the MOS field effect transistor. Additionally, the Si(111) substrate may be applied as the substrate. In this case, the high frequency integrated circuit including the bipolar transistor and the bulk acoustic wave resonator can be integrated on the Si(111) substrate thereby the mobile communications terminal as represented by the cellular phone can be further downsized. Incidentally, the above described manufacturing process is illustrative only and it is not intended to be limited to the embodiment, and various changes may be made therein.

As thus described above, the filter, the high frequency module and the semiconductor integrated circuit device for cellular phones are described as the representative example in the embodiment 3–5. However the present invention is not limited to cellular phones and it can be applied to another radio communication equipment. In this case, the radio communication equipment can be downsized and the cost also can be reduced in the same way. Additionally, the present invention relates to the filter, especially, the high frequency filter operated within several hundred MHz-several GHz or more for the mobile communication as represented by cellular phones. Among various filtering technologies, the filter manufactured by the bulk acoustic wave resonator is high frequency and compact, and has excellent temperature characteristic and electric strength.

What is claimed is:

1. A bulk acoustic wave resonator comprising:
   a substrate including a first surface;
   a second surface opposite to the first surface;
   a first air gap including a first aperture opening at the first surface and having a tapered shape;
   a second air gap including a second aperture opening at the second surface, having the generally vertical shape to the first surface and connecting to the first air gap; and
   a stacked resonator placed on the first surface such that a portion of the stacked resonator is overlapped with the first aperture and having a stacked structures, wherein the first air gap becomes narrower toward the first aperture opening.

2. The bulk acoustic wave resonator according to claim 1, wherein the substrate is a Si(100) substrate and at least one of the first surface and the second surface is a (100)plane.

3. The bulk acoustic wave resonator according to claim 2, wherein the stacked resonator including:
a first electrode layer;
a second electrode layer; and
a piezoelectric layer having a portion sandwiched between the first electrode layer and the second electrode layer in the direction to which the first electrode layer and the second electrode layer are stacked.

4. The bulk acoustic wave resonator according to claim 3, wherein the first electrode layer has a portion overlapped with the first aperture and is in contacted with the first surface.

5. The bulk acoustic wave resonator according to claim 2, wherein the staked resonator includes:
a first layer having the overlapped portion with the first aperture and being in contact with the first surface;
a first electrode layer having the overlapped portion with the first layer in the direction to which the first layer is stacked;
a second electrode layer; and
a piezoelectric layer having a portion sandwiched between the first electrode layer and the second electrode layer in the direction to which the first electrode layer and the second electrode layer are stacked.

6. The bulk acoustic wave resonator according to claim 3, wherein at least one of the first electrode layer and the second electrode layer contain at least one of molybdenum and tungsten as a main component.

7. The bulk acoustic wave resonator according to claim 5, wherein the first layer contains at least one of silicon oxide, silicon nitride, alumina, aluminum nitride and silicon carbide as a main component.

8. A bulk acoustic wave resonator comprising:
a Si(100) substrate including:
a first surface;
a second surface opposite to the first surface;
a first air gap having a first aperture opening at the first surface and including a (111) plane therein; and
a second air gap including a second aperture opening the second surface, connecting to the first air gap and having a generally vertical shape to the first surface; and
a stacked resonator placed on the first surface such that a portion of the stacked resonator is overlapped with the first aperture and having a stacked structure, wherein the first air gap becomes narrower toward the first aperture opening.

9. The bulk acoustic wave resonator according to claim 8, wherein the stacked resonator includes:
a first electrode layer;
a second electrode layer; and
a piezoelectric layer having a portion sandwiched between the first electrode layer and the second electrode layer in the direction to which the first electrode layer and the second electrode layer are stacked.

10. The bulk acoustic wave resonator according to claim 9, wherein the first electrode layer has an overlapped portion with the first aperture and is in contact with the first surface.

11. The bulk acoustic wave resonator according to claim 8, wherein the stacked resonator includes:
a first layer having an overlapped portion with the first aperture and overlaying the first surface;
a first electrode layer having a overlapped portion with the first layer in the direction to which the first layer is stacked;
a second electrode layer; and
a piezoelectric layer having a portion sandwiched between the first electrode layer and the second electrode layer in the direction to which the first electrode layer and the second electrode layer are stacked.

12. The bulk acoustic wave resonator according to claim 9, wherein at least one of the first electrode layer and the second electrode layer contain at least one of molybdenum and tungsten as a main component.

13. The bulk acoustic wave resonator according to claim 11, wherein the first layer contains at least one of silicon oxide, silicon nitride, alumina, aluminum nitride and silicon carbide as a main component.

14. A bulk acoustic wave resonator comprising:
a Si(111)substrate including:
a first surface;
a second surface opposite to the first surface;
a first air gap having a first aperture opening at the first surface and formed by wet-etching; and
a second air gap including the second aperture opening at the second surface, connecting to the first air gap and having a generally vertical shape to the first surface; and
a stacked resonator placed on the first surface such that a portion of the stacked resonator is overlapped with the first aperture and having a stacked structures, wherein the first air gap becomes narrower toward the first aperture opening.

15. The bulk acoustic wave resonator according to claim 14, wherein the stacked resonator includes:
a first electrode layer;
a second electrode layer; and
a piezoelectric layer having a portion sandwiched between the first electrode layer and the second electrode layer in the direction to which the first electrode layer and the second electrode layer are stacked.

16. The bulk acoustic wave resonator according to claim 15, wherein the first electrode layer has an overlapped portion with the first aperture and is in contact with the first surface.

17. The bulk acoustic wave resonator according to claim 14, wherein the stacked resonator includes:
a first layer having an overlapped portion with the first aperture and overlaying the first surface;
a first electrode layer having an overlapped potion with the first layer;
a second electrode layer; and
a piezoelectric layer having a portion sandwiched between the first electrode layer and the second electrode layer in the direction to which the first electrode layer and the second electrode layer are stacked.

18. The bulk acoustic wave resonator according to claim 15, wherein at least one of the first electrode layer and the second electrode layer contain at least one of molybdenum and tungsten as a main component.

19. The bulk acoustic wave resonator according to claim 17, wherein the first layer contains at least one of silicon oxide, silicon nitride, alumina, aluminum nitride and silicon carbide as a main component.

* * * * *